United States Patent
Gallavan

(10) Patent No.: US 8,004,286 B2
(45) Date of Patent: Aug. 23, 2011

(54) VOLTAGE MEASUREMENT INSTRUMENT AND METHOD HAVING IMPROVED AUTOMATIC MODE OPERATION

(75) Inventor: Michael F. Gallavan, Edmonds, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 12/627,811

(22) Filed: Nov. 30, 2009

(65) Prior Publication Data

US 2010/0072981 A1  Mar. 25, 2010

Related U.S. Application Data

(62) Division of application No. 11/633,979, filed on Dec. 4, 2006, now Pat. No. 7,642,788.

(51) Int. Cl.
*G01R 31/08* (2006.01)
*G01R 31/02* (2006.01)

(52) U.S. Cl. ......... 324/522; 324/72.5

(58) Field of Classification Search ......... 324/522, 324/72.5
See application file for complete search history.

(56) References Cited

U.S. PATENT DOCUMENTS

| | | | |
|---|---|---|---|
| 5,117,180 A | 5/1992 | Swerlein | 324/132 |
| 5,144,226 A | 9/1992 | Rapp | 324/132 |
| 5,250,893 A | 10/1993 | Gambill et al. | 324/115 |
| 5,508,607 A | 4/1996 | Gibson | 324/121 R |
| 6,127,828 A | 10/2000 | Kamitani | 324/548 |
| 6,154,503 A * | 11/2000 | Strolle | 375/264 |

FOREIGN PATENT DOCUMENTS

| | | |
|---|---|---|
| EP | 0696742 A2 | 2/1996 |
| EP | 0961120 A2 | 12/1999 |

OTHER PUBLICATIONS

O'Shea, Paul, "The fundamentals on Hand-Held DMM Specifications", Evaluation Engineering, Feb. 1997, pp. 16-22.

Taha, Saleem et al, "Microcomputer-controlled Autoranging DMM with Autocalibration", Int. J. Electronics, vol. 62, No. 1, 1987, pp. 105-113.

* cited by examiner

*Primary Examiner* — Amy He
(74) *Attorney, Agent, or Firm* — Christensen O'Connor Johnson Kindness PLLC

(57) ABSTRACT

Voltage measuring instruments and methods of measuring the amplitude of an input signal are disclosed. In an example method of measuring the amplitude of an input signal, in an AC measurement mode, the input signal is coupled through a capacitor, the RMS amplitude of the input signal coupled through the capacitor is determined, and a digital value corresponding to the RMS amplitude is provided. In an automatic measurement mode, the RMS amplitude of the input signal is determined without first coupling the input signal through the capacitor, and a digital value corresponding to the RMS amplitude of the input signal is provided. Further disclosed is a calibration procedure may be used to compensate for any offset of an amplifier of the voltage measuring instrument.

7 Claims, 4 Drawing Sheets

VOLTAGE MEASUREMENT INSTRUMENT AND METHOD HAVING IMPROVED AUTOMATIC MODE OPERATION

CROSS-REFERENCE TO RELATED APPLICATION

This application is a divisional of U.S. patent application Ser. No. 11/633,979, filed Dec. 4, 2006. This application is incorporated by reference herein in its entirety and for all purposes.

TECHNICAL FIELD

This invention relates to test and measurement equipment, and, more particularly, to a circuit and method for switching a signal to an alternating current ("AC") and direct current ("DC") voltage measurement instrument in a manner that allows accurate voltage measurements.

BACKGROUND OF THE INVENTION

Instruments for measuring the voltage of an AC or DC signal have been in existence for a long time, and they are in common use in a wide variety of fields. Early voltage measuring instruments, commonly known as "volt-ohm meters," used an analog meter having a pointer with an angular position indicative of the amplitude of a DC voltage. Such meters could also measure the amplitude of AC signals by rectifying the AC signal and scaling the amplitude to correspond to the root-mean-squared (RMS") value of the signal. Later volt-ohm meters used a digital display, and were substantially more accurate than analog meters.

Although conventional volt-ohm meters could measure the RMS amplitude of an AC signal, the accuracy of such measurement was based on the assumption that the AC signal had a sinusoidal waveshape. Such volt-ohm meters could not accurately measure the RMS amplitude of a non-sinusoidal AC signal. For this reason, true RMS meters were developed using a variety of techniques.

A block diagram of a conventional AC/DC voltage measuring instrument 10 is shown in FIG. 1. The instrument 10 includes a pair of terminals 12, 14 between which the signal to be measured is applied, generally using a test probe. The terminal 14 is coupled to ground, and the terminal 12 is coupled to several devices. More specifically, the terminal 12 is coupled through a resistor 18 to a comparator and logic circuit 20, through a resistor 24 and switch 26 to test node 30, and through a capacitor 32, resistor 34 and a switch 36 to the test node 30. The test node 30 is connected to ground through a resistor 38 to form a voltage divider with one of the resistors 24, 34.

The test node 30 is connected to an analog-to-digital ("A/D") converter 40 through a switch 42. A digital signal at the output of the A/D converter 40 is applied to a display 44, and/or it may be applied to other circuits or systems (not shown). The test node 30 is also connected to an input of an amplifier 46. An output of the amplifier 46 is coupled through a capacitor 48 to an RMS circuit 50, which provides an accurate measurement of RMS amplitude of a signal applied to its input. An output of the RMS circuit 50 is coupled through a switch 54 to the A/D converter 40.

The voltage measuring instrument 10 has three operating modes, namely a DC measurement mode, an AC measurement mode, and an automatic measurement mode. These modes are selected by a control unit 60 selectively closing the switches 26, 36, 42, 54. The control unit 60 is, in turn, controlled by either a user selection device 62 or an output from the comparator and logic circuit 20, as explained in greater detail below. The control unit 60 is also connected to the display 44 so that it can show the mode that is currently in use. In the DC measurement mode or the AC measurement mode, the control unit 60 causes the display 44 to display whatever mode is selected through the user selection device 62. However, in the automatic measurement mode, the control unit 60 is controlled by the comparator and logic circuit 20 to cause the display 44 to indicate "Automatic" and to also display "AC" if the comparator and logic circuit 20 detects zero crossings and to otherwise display "Automatic" and "DC."

When the amplitude of a DC voltage is to be measured, the DC measurement mode is selected through the user selection device 62. The selection device 62 then causes the control unit 60 to close the switches 26 and 42 while the switches 36 and 54 remain open. Closing of the switch 26 connects the input terminal 12 to the test node 30 so that the resistor 24 forms a voltage divider with the resistor 38. The amplitude of the voltage at the test node 30 is thus proportional to the amplitude of the signal applied between the input terminals 12, 14. The test node 30 is connected by the closed switch 42 directly to the A/D converter 40. The A/D then outputs a digital signal indicative of the amplitude of the signal applied between the terminals 12, 14, and the display 44 provides the user with an indication of the amplitude of the DC voltage applied between the terminals 12, 14.

When the amplitude of an AC voltage is to be measured, the AC measurement mode is selected, again through the user selection device 62. The selection device 62 then causes the control unit 60 to close the switches 36 and 54 while the switches 26 and 42 remain open. Closing of the switch 36 connects the input terminal 12 to the test node 30 through the capacitor 32 so that only an AC signal is coupled through the resistor 34, which forms a voltage divider with the resistor 38. The amplitude of the voltage at the test node 30 is thus proportional to the amplitude of the AC signal applied between the input terminals 12, 14. The amplitude of this AC signal at the test node 30 is boosted by the amplifier 46 and coupled through the capacitor 48 to the input of the RMS circuit 50. Although the capacitor 32 passes only AC signals, use of the capacitor 48 is desirable to eliminate offsets that are typically generated by the amplifier 46. In the AC measurement mode, the output of the RMS circuit 50 is coupled through the closed switch 54 to the A/D converter 40. The A/D converter 40 thus outputs a digital signal indicative of the RMS amplitude of the AC signal applied between the terminals 12, 14. The RMS amplitude of this signal is then displayed by the display 44.

In the automatic measurement mode, the voltage measuring instrument 10 switches between the DC measurement mode and the AC measurement mode based on the nature of the signal applied between the terminals 12, 14. This function is accomplished by the comparator and logic circuit 20 detecting zero crossings of the signal to be measured. If the circuit 20 detects zero crossings of the signal applied between the terminals 12, 14, it assumes the signal is an AC signal. It therefore sends a corresponding signal to the control unit 60, which closes the switches 36, 54 to place the instrument 10 in the AC measurement mode, as explained above. If the circuit 20 does not detect zero crossings, it assumes the signal applied between the terminals 12, 14 is a DC signal. The circuit 20 therefore sends a corresponding signal to the control unit 60, which closes the switches 26, 42 to place the instrument 10 in the DC measurement mode, as also explained above.

The voltage measuring instrument 10 shown in FIG. 1 works well in many applications, particularly where the signal to be measured is a pure DC signal or a pure AC signal. However, it does not provide accurate results where the signal to be measured is a DC signal with an AC component or an AC signal having a DC offset. If the AC component is sufficiently large in relation to the DC offset, the comparator and logic circuit 20 will detect zero crossings and therefore switch the instrument 10 to the AC measurement mode. However, the capacitors 32, 48 will block the DC component so that only the AC component will be measured. The RMS circuit 50 will therefore produce a digital output that is indicative of the RMS amplitude of only the AC component. Yet the true RMS amplitude is affected by the DC component as well as the AC component.

Another problem develops if the AC component is relatively small in relation to the DC offset. In such case, the comparator and logic circuit 20 will not detect zero crossings and therefore switch the instrument 10 to the DC measurement mode. The instrument 10 will then provide spurious measurements of the DC amplitude of the signal, which will vary depending upon the sample point used by the A/D converter 40. These inconsistent measurements may indicate to the user that the DC voltage is continuously changing when, in fact, it is constant.

There is therefore a need for voltage measuring instrument and method that can provide accurate measurements of the voltage of signals in an Automatic measurement mode, including DC signals with an AC component or AC signals having a DC offset.

SUMMARY OF THE INVENTION

A voltage measurement instrument and method measures the amplitude of an input signal in either a DC measurement mode, and AC measurement mode or an automatic measurement mode. In the DC measurement mode, the amplitude of the input signal is sampled by an analog-to-digital converter, which generates a digital value corresponding to the amplitude of the sample. In the AC measurement mode, the input signal is coupled through a capacitor to an RMS circuit, which determines the RMS amplitude of the input signal after being coupled through the capacitor. A digital value corresponding to the RMS amplitude is then generated. In the automatic measurement mode, the input signal is coupled directly to the RMS circuit without first coupling the input signal through a capacitor. In the automatic mode, the input signal is preferably coupled to the RMS circuit through an amplifier. The voltage measurement instrument performs a calibration procedure to calculate a correction factor to compensate for any offset generated by the amplifier. This correction factor is used in the automatic mode to display a corrected RMS amplitude value.

DETAILED DESCRIPTION

Figure 1:
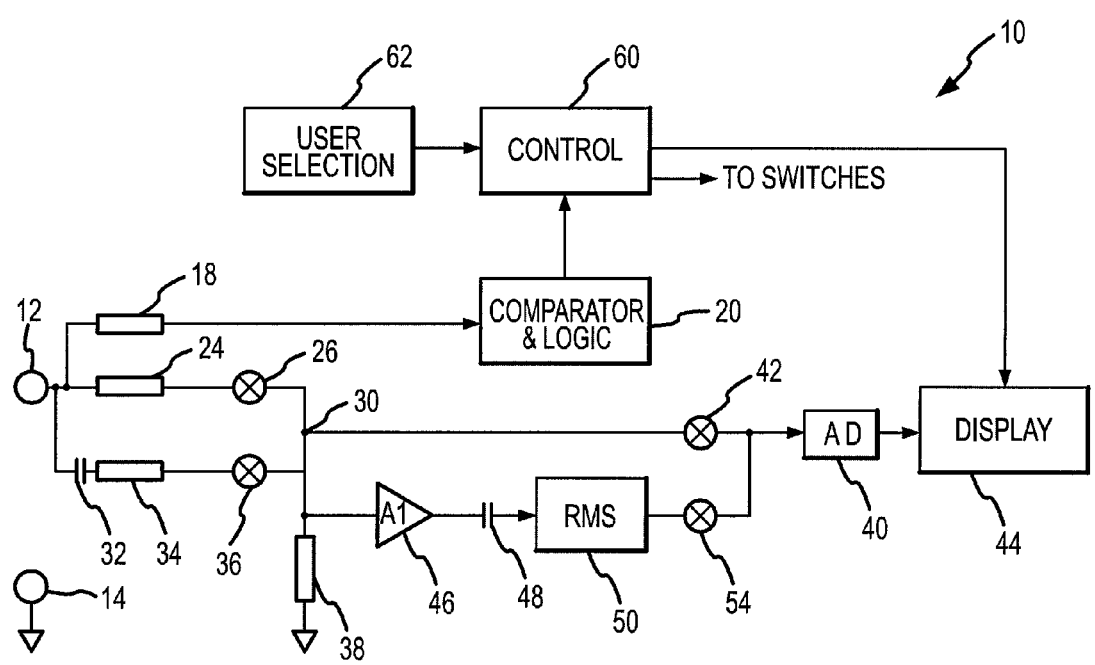
FIG. 1 is a block diagram of one example of a conventional AC/DC voltage measuring instrument.
Figure 2:
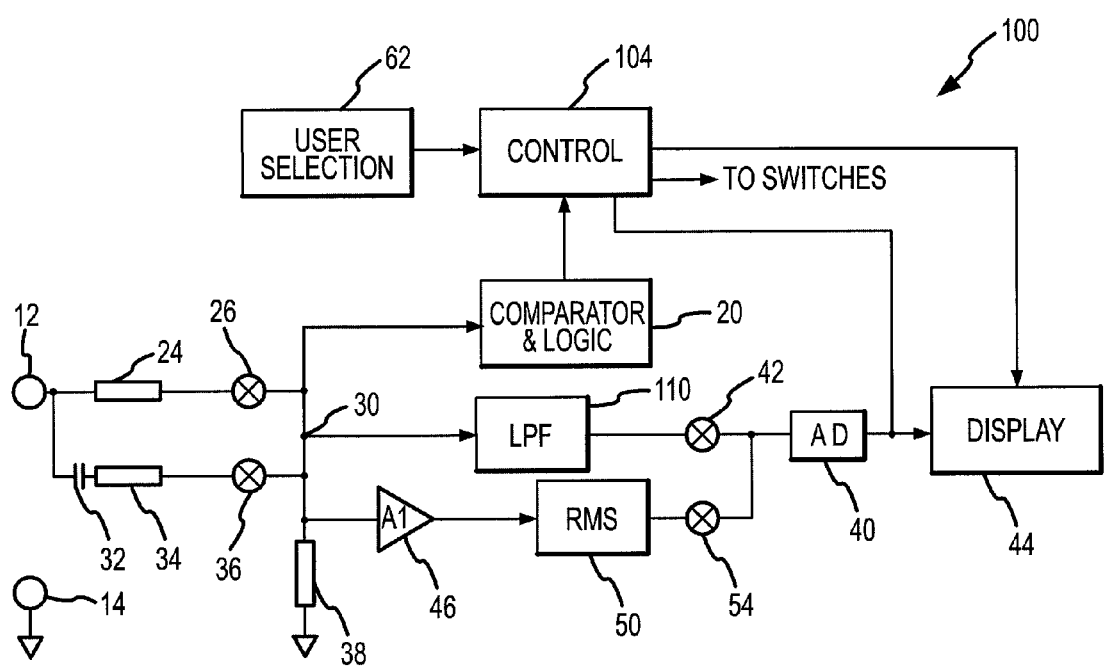
FIG. 2 is a block diagram of an AC/DC voltage measuring instrument according to one example of the invention.

A voltage measurement instrument 100 according to one example of the invention is shown in FIG. 2. The instrument 100 has some similarities to the voltage measurement instrument 10 shown in FIG. 1, including the resistor 24 and switch 26 coupled between the terminal 12 and the test node 30 used to measure the amplitude of DC signals, and the capacitor 32, resistor 34 and switch 36 coupled between the terminal 12 and the test node 30 used to measure the amplitude of AC signals. The voltage measuring instrument 100 also includes the switch 42, which is closed to connect the test node 30 to the A/D converter 40 for measuring the amplitude of DC signals, and the amplifier 46, RMS circuit 50 and the switch 54, which is closed for measuring the amplitude of AC signals. Finally, the instrument 100 also includes a control unit 104 and the user selection device 62. However, the control unit 104 has been provided with a different reference number because it differs in structure and function from the structure and function of the control unit 60 used in the instrument 10.

The voltage measurement instrument 100 of FIG. 2 differs from the instrument 10 of FIG. 1 in several important respects. First, the instrument 100 includes a low pass filter 110 in the path used to measure the amplitude of DC signals. The low pass filter 110 filters out any AC component in the signal to be measured so that the amplitude display does not fluctuate with different samples taken by the A/D converter 40. The instrument 100 thus provides a consistent and accurate measurement of the amplitude of DC signals. Additionally, for reasons that will also be explained below, the output of the A/D converter 40 is connected to the control unit 104.

In the AC measurement mode, the voltage measuring instrument 100 operates in essentially the same manner as the instrument 10 as explained below, except that it does not include the capacitor 48 used by the instrument 10 to eliminate any offset in the amplifier 46. Instead, as explained in greater detail below, the control unit 104 performs a calibration procedure to eliminate any offset in the amplifier 46.

The most significant difference between the voltage measuring instrument 100 and the prior art instrument 10 is its operation in the automatic measurement mode. When the automatic measurement mode is selected using the user selection device 62, the control unit 104 closes the switches 26, 54 and opens the switches 36, 42. Furthermore, the switches 26, 54 remain closed and the switches 36, 42 remain open regardless of whether or not the comparator and logic circuit 20 detects zero crossings. The sole function of the comparator and logic circuit 20 is therefore to control the display 44 in the same manner it controls the display 44 in the automatic measurement mode in the prior art instrument 10, as explained above. Unlike the comparator and logic circuit 20 in the conventional instrument 10, the comparator and logic circuit 20 in the instrument 100 does not cause the control unit 104 to control any of the switches 26, 54, 36, 42 in the automatic mode.

By coupling the RMS circuit 50 to the terminal 12 without any intervening capacitor or other high pass filter, the RMS circuit is able to provide an accurate measurement of RMS amplitude regardless of the nature of the signal. If, for example, the signal is a DC signal with a large AC component, the RMS circuit will provide a true indication of the RMS value of the signal, which will take into account both the DC component and the AC component of the signal.

Figure 3:
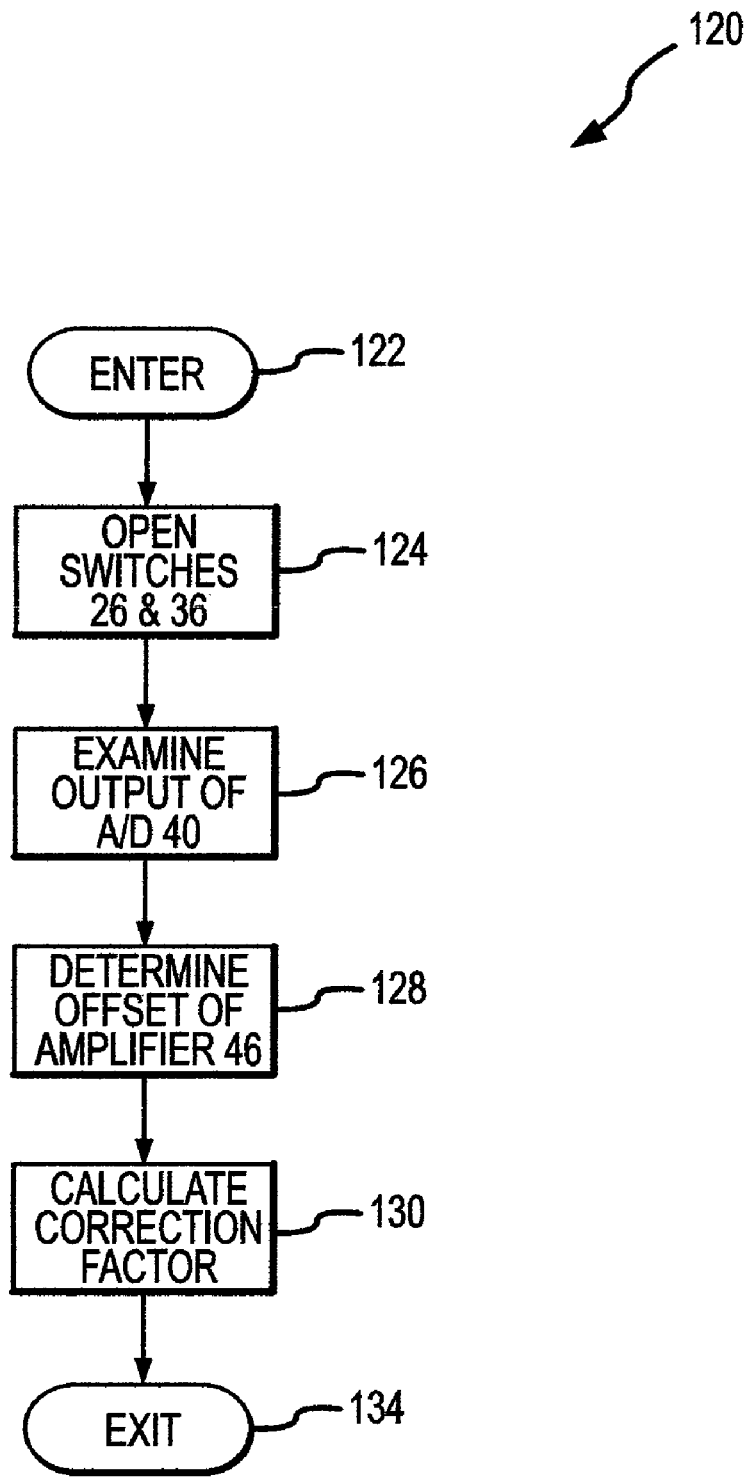
FIG. 3 is a flow chart showing one example of a calibration procedure that may be used to calibrate any offset in an amplifier used in the voltage measuring instrument of FIG. 2.

As mentioned above, the instrument 100 is able to dispense with the use of a capacitor to eliminate offsets of the amplifier 46 because the control unit 104 performs a calibration procedure. As shown in FIG. 3, this calibration procedure 120 is entered at 122 and the control unit 104 then opens switches 26 and 36. Resistor 38 then brings node 30 to zero volts. The control unit 104 then examines the output of the A/D converter 40. If the A/D converter 40 provides an RMS amplitude indication of other than zero, the control unit 104 determines at step 128 the offset of the amplifier 46 corresponding to this RMS amplitude. The control unit 104 then calculates a correction factor at step 130 that will be used for subsequent measurements in the AC measurement mode and the automatic measurement mode. Finally, the calibration procedure exits at step 134. Although one example of a calibration procedure is shown in FIG. 3, it will be understood that other calibration procedures may be used to compensate for any offset of the amplifier 46 and RMS converted 50. Regardless of what calibration procedure is used, the use of a calibration procedure to compensate for offset of the amplifier 46 allows the RMS circuit 50 to be connected through a DC circuit path in the AC measurement mode and in the automatic measurement mode regardless of the nature of the signals applied between the terminals 12, 14. As a result, the voltage measuring instrument 100 is able to provide more accurate measurements when the amplitude of a signal has both AC and DC components.

Figure 4:
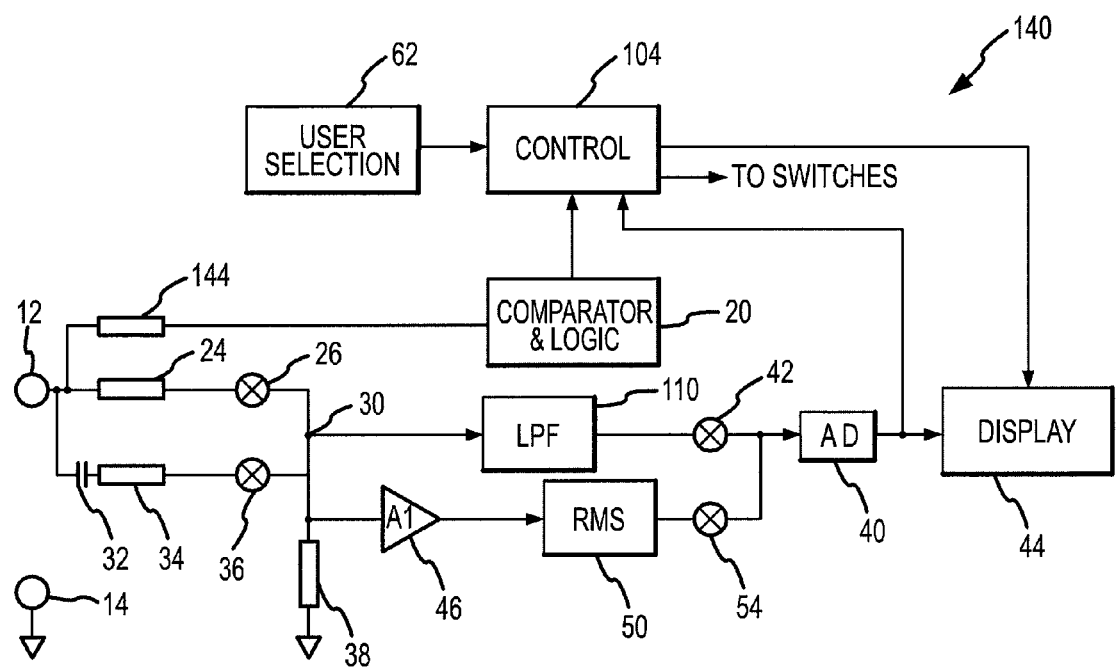
FIG. 4 is a block diagram of an AC/DC voltage measuring instrument according to another example of the invention.

Another example of a voltage measuring instrument 140 is shown in FIG. 4. The voltage measuring instrument 140 includes all of the same components that are used in the voltage measuring instrument 100 of FIG. 2 operating in essentially the same manner. The instrument 140 differs from the instrument 100 by connecting the comparator and logic circuit 20 to the terminal 12 through a resistor 144 rather than connecting it directly to the test node 30 as in the instrument 100.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A method of measuring the amplitude of an input signal in a voltage measuring instrument having a plurality of measurement modes, the method comprising:

in an AC measurement mode, coupling the input signal through a capacitor, determining the RMS amplitude of the input signal coupled through the capacitor, and providing a digital value corresponding to the RMS amplitude; and in an automatic measurement mode, determining the RMS amplitude of the input signal without first coupling the input signal through the capacitor, and providing a digital value corresponding to the RMS amplitude of the input signal.

2. The method of claim 1, further comprising amplifying the input signal in the automatic measurement mode before determining the RMS amplitude of the input signal.

3. The method of claim 2, further comprising performing a calibration procedure in the automatic measurement mode to compensate for any offset generated during the act of amplifying the input signal.

4. The method of claim 3 wherein the calibration procedure comprises:

making the input signal have a predetermined voltage;

examining the amplified input signal to determine if the amplitude of the amplified input signal corresponds to the predetermined voltage;

if the amplitude of the amplified input signal does not correspond to the predetermined voltage, calculating a correction factor; and using the correction factor in determining the RMS amplitude of the input signal.

5. The method of claim 1, further comprising in a DC measurement mode of measuring the amplitude of the input signal, sampling the amplitude of the input signal and converting the sample to a digital value corresponding to the amplitude of the sample.

6. The method of claim 5, further comprising displaying the digital value corresponding to the amplitude of the sample in the DC measurement mode, and displaying the digital value corresponding to the RMS amplitude in the AC measurement mode and the automatic mode.

7. The method of claim 5, further comprising low-pass filtering the input signal in the DC measurement mode before sampling the amplitude of the input signal.

* * * * *